(12) United States Patent
Ina et al.

(10) Patent No.: US 7,075,618 B2
(45) Date of Patent: Jul. 11, 2006

(54) APPARATUS CONTROL SYSTEM, APPARATUS CONTROL METHOD, SEMICONDUCTOR EXPOSURE APPARATUS, SEMICONDUCTOR EXPOSURE APPARATUS CONTROL METHOD AND SEMICONDUCTOR DEVICE MANUFACTURING METHOD

(75) Inventors: Hideki Ina, Kanagawa (JP); Takehiko Suzuki, Saitama (JP); Koichi Sentoku, Tochigi (JP); Takahiro Matsumoto, Tochigi (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 120 days.

(21) Appl. No.: 10/269,984

(22) Filed: Oct. 15, 2002

(65) Prior Publication Data

US 2003/0071980 A1 Apr. 17, 2003

(30) Foreign Application Priority Data

Oct. 17, 2001 (JP) .................................... 2001-319452

(51) Int. Cl.
G03B 27/42 (2006.01)
G03B 27/32 (2006.01)

(52) U.S. Cl. ...................................... 355/53; 355/77
(58) Field of Classification Search ................. 355/53, 355/55, 77; 356/399, 400, 401; 358/1.15; 250/548

See application file for complete search history.

(56) References Cited

U.S. PATENT DOCUMENTS

| 4,920,505 A | 4/1990 | Suzuki | 364/525 |
|---|---|---|---|
| 4,958,160 A | 9/1990 | Ito et al. | 355/53 |
| 5,243,377 A * | 9/1993 | Umatate et al. | 355/53 |
| 5,525,808 A | 6/1996 | Irie et al. | 250/548 |
| 5,585,923 A | 12/1996 | Nose et al. | 356/363 |
| 5,625,453 A | 4/1997 | Matsumoto et al. | 356/351 |
| 5,627,624 A | 5/1997 | Yim et al. | 355/53 |
| 5,847,974 A | 12/1998 | Mori et al. | 364/571.02 |
| 5,898,478 A | 4/1999 | Yim et al. | 355/53 |
| 5,910,843 A | 6/1999 | Oishi | 356/375 |
| 6,185,472 B1 | 2/2001 | Onga et al. | 700/121 |
| 2002/0097427 A1 * | 7/2002 | Kazama et al. | 358/1.15 |

FOREIGN PATENT DOCUMENTS

| JP | 2000-173921 | 6/2000 |
|---|---|---|
| JP | 2001-237298 | 8/2001 |

OTHER PUBLICATIONS

European Search Report dated Jun. 18, 2004, issued in corresponding European patent appln. No. 02 25 7029, forwarded in a Communication dated Jun. 28, 2004.

* cited by examiner

Primary Examiner—Peter B. Kim
(74) Attorney, Agent, or Firm—Fitzpatrick, Cella, Harper & Scinto

(57) ABSTRACT

A system for controlling an apparatus. The system includes an operating device for operating the apparatus based on a first parameter value and a second parameter value, an inspecting device for inspecting operation results of the apparatus corresponding to the first parameter value, an estimating device for estimating operation results of the apparatus corresponding to the first parameter value on the basis of the operation results corresponding to the first parameter value, and a revising device for revising parameter values to operate the apparatus on the basis of the operation results obtained by the inspecting device and the estimated operation results obtained by the estimating device.

21 Claims, 12 Drawing Sheets

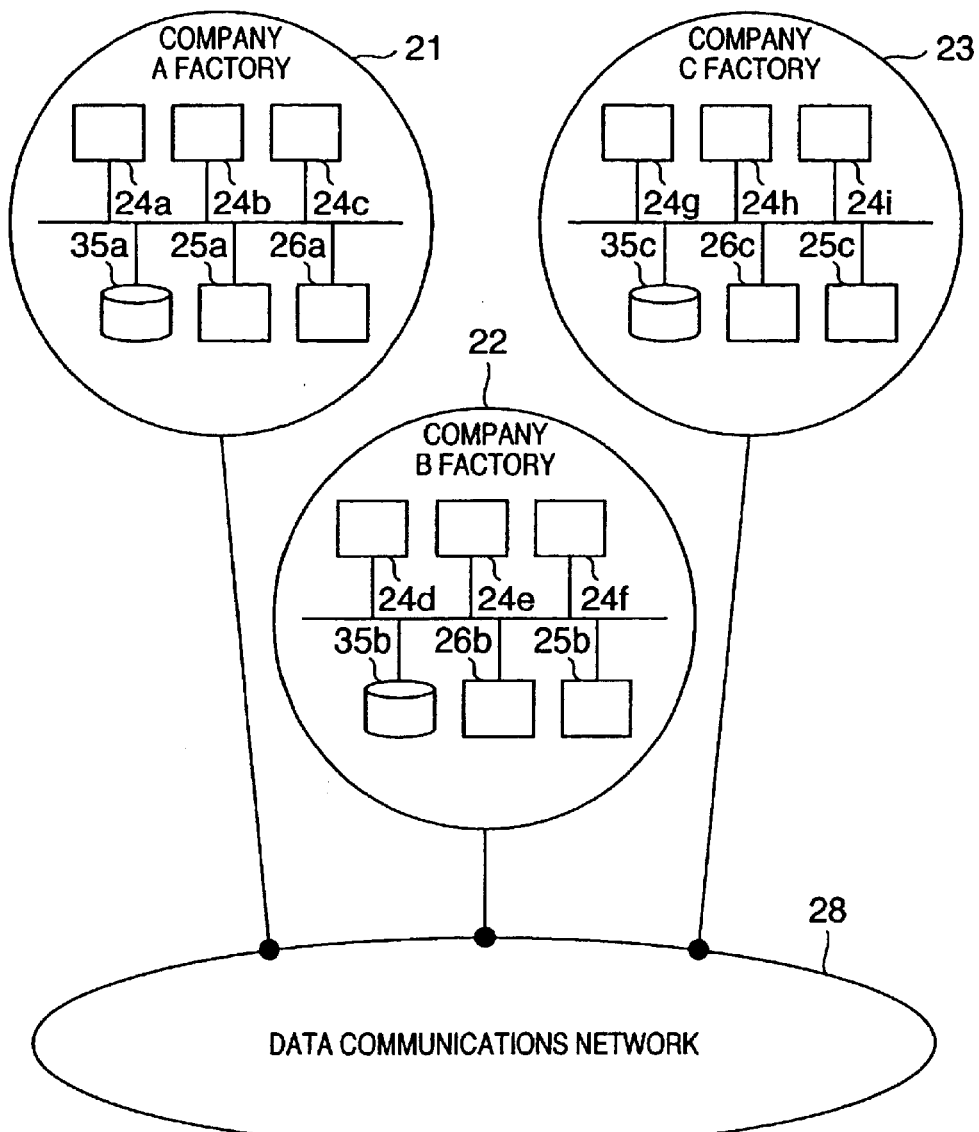
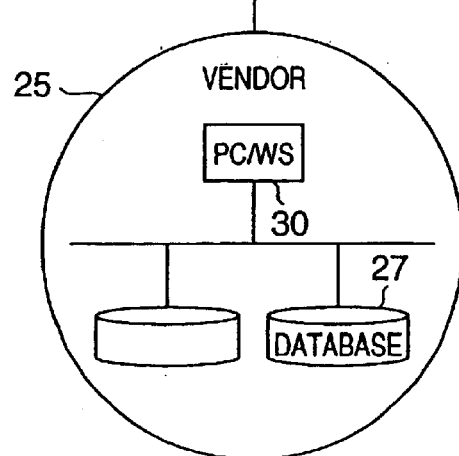
FIG. 3

FIG. 4

| | | SEMICONDUCTOR EXPOSURE APPARATUS 1 | SEMICONDUCTOR EXPOSURE APPARATUS 2 | ........ |
|---|---|---|---|---|
| CONDITION 1 | ALIGNMENT | a1 | a2 | |
| | ALIGNMENT INSPECTION RESULTS | b1 | b2 | |
| | ALIGNMENT MARK-RELATED INFORMATION | c1 | c2 | |
| | LIGHTING MODE | d1 | d2 | |
| | SHOT ARRANGEMENT | e1 | e2 | |
| | WAFER MAGNIFICATION | f1 | f2 | |
| | WAFER ROTATION | g1 | g2 | |
| | SHIFT | h1 | h2 | |

FIG. 5

| CONDITION 1 | ALIGNMENT CONDITION 1 |
|             | ALIGNMENT RESULT 1    |
| CONDITION 2 | ALIGNMENT CONDITION 2 |
|             | ALIGNMENT RESULT 2    |
| ⋮           | ⋮                     |
| CONDITION n | ALIGNMENT CONDITION n |
|             | ALIGNMENT RESULT n    |

SEMICONDUCTOR DEVICE PRODUCTION FLOW

MARK WAVEFORM EXAMPLE

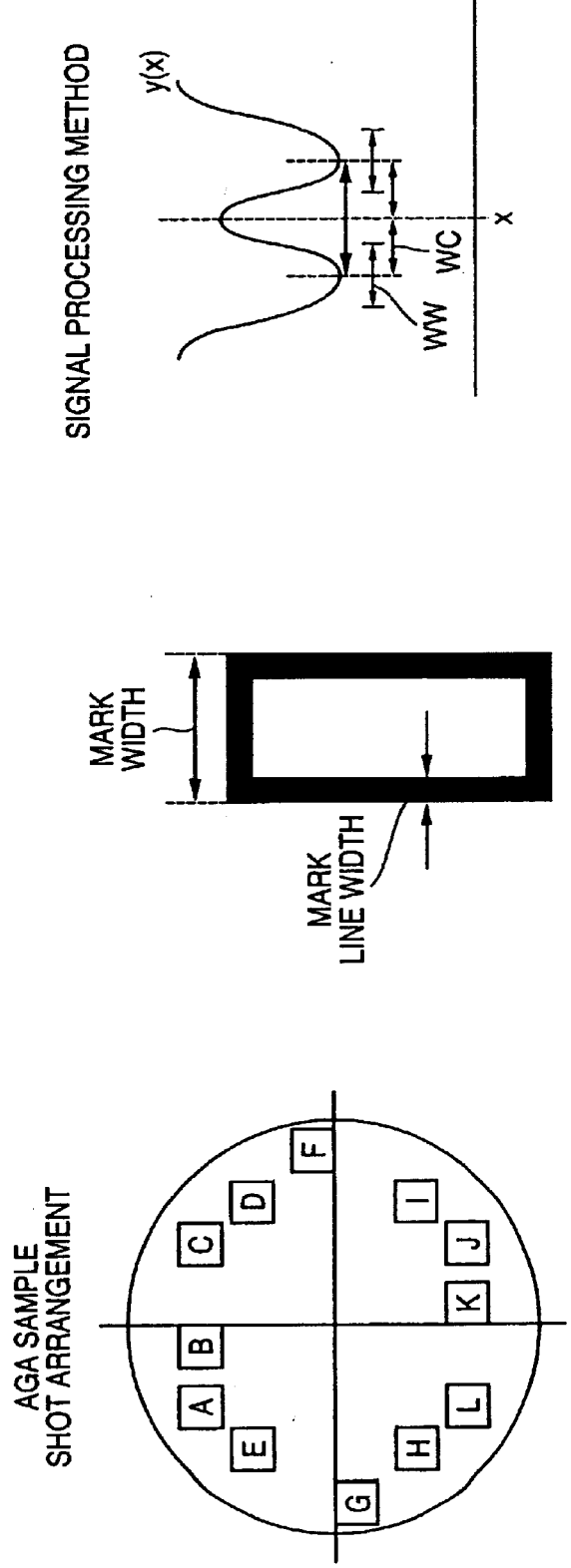

APPARATUS CONTROL SYSTEM, APPARATUS CONTROL METHOD, SEMICONDUCTOR EXPOSURE APPARATUS, SEMICONDUCTOR EXPOSURE APPARATUS CONTROL METHOD AND SEMICONDUCTOR DEVICE MANUFACTURING METHOD

FIELD OF THE INVENTION

The present invention relates to an apparatus control system for controlling the operating condition of an industrial apparatus, an apparatus control method, a semiconductor exposure apparatus that is the target of control in such a control system and a semiconductor exposure apparatus control method.

BACKGROUND OF THE INVENTION

In semiconductor exposure apparatuses for manufacturing semiconductor devices, finer and more densely integrated circuits require projected exposures at ever-higher resolutions in order to transfer the circuit pattern on a master (hereinafter referred to as a reticle) onto a silicon wafer substrate. Since the circuit pattern projection resolution is determined by the number of apertures (NA) in the projection system as well as the wavelength of the exposure, the resolution has been increased by increasing the exposure system NA and by increasing the exposure wavelength. In the latter method, the type of exposure light source wavelength used has changed from gamma rays to infrared rays, and further, is in the process of changing again from infrared rays to an excimer laser. At present, semiconductor exposure apparatuses having oscillation wavelengths of 248 nm or 193 nm have already been commercialized and are already in use.

Moreover, at present, 157 nm wavelength VUV (vacuum-ultraviolet) as well as 1.3 nm wavelength EUV (extreme-ultraviolet radiation) are currently being studied as possible exposure methods for the next generation of semiconductor exposure apparatuses.

At the same time, as circuit patterns become ever-finer, the need for high-accuracy alignment of the reticle on which the circuit pattern is formed and the wafer on which the reticle pattern is projected has also increased. The required accuracy is to within one-third of the circuit line width. Thus, for example, if the design width of the current circuit line is 180 nm, then the required accuracy of alignment is within 60 nm. In addition, a wide variety of device structures has been proposed and are under study for commercialization. As the number of personal computers in use increases, the main driving force behind circuit miniaturization has changed from the DRAM-driven memory to the CPU chip. It is likely that such miniaturization will increase with future additional advances in information technology such as household wireless LANs, Bluetooth communications systems devices, (ITS) (Intelligent Transport Systems) typified by car-mounted radars using frequencies of 77 GHz, and MMIC (Millimeter-wave Monolithic Integrated Circuits) used in LMDS (Local Multipoint Distribution Service) systems utilizing frequencies of 24–38 GHz.

Moreover, semiconductor device production processes also vary widely, from the W-CMP (Tungsten Chemical Mechanical Polishing) process that is already becoming a thing of the past to the Cu Dual Damascene process currently being eyed as planarization technologies for solving the problem of a lack of depth of focus of projection optical systems of semiconductor exposure apparatuses.

Finally, semiconductor device structures and materials also vary widely, for example, from the proposed P-HEMT (Pseudomorphic High Electron Mobility Transistor) and M-HEMT (Metamorph-HEMT) formed by combining compounds such as GaAs and InP to the proposed HBT (Heterojunction Bipolar Transistor) using SiGe, SiGeC, and the like.

Given the current state of the semiconductor industry as described above, as long as semiconductor manufacturing apparatuses, such as semiconductor exposure apparatuses, are used, the number of apparatus parameters that should be optimized is very large and depends on the exposure systems used and products produced. Moreover, these parameters are not independent of each other, but are instead closely interrelated.

Conventionally, the optimum values of the parameters are set by the device maker/purchaser of the apparatus through trial and error, which means that a substantial amount of time is required to establish these optimum values. In addition, even after the optimum values of the parameters have once been set, for example, if a process error occurs, changes in the production process dictated by the error may require changing the optimum values of the parameters of the production apparatus, which also requires a substantial amount of time.

In addition, in the production of semiconductor devices, the amount of time that can be spared from start-up to production is strictly limited, and so, of course, is the time that can be given to re-establishing the optimum values for the parameters.

Moreover, from a cost of ownership standpoint, it is necessary to improve the utilization of the production equipment, so it is therefore necessary that any changes in optimum values of parameters that have already been established should be carried out quickly. Under these circumstances, it is very difficult to manufacture a wide variety of semiconductor devices at optimum parameter values, and ultimately, even production equipment capable of obtaining a high yield, if used without optimizing the parameter values, will obtain only a sub-standard yield and lead to an overall decrease in yield for no apparent cause. Such a reduction in yield can lead to an increase in production costs and a decrease in shipments, with a consequent loss of competitiveness.

SUMMARY OF THE INVENTION

Accordingly, the present invention has been proposed to solve the above-described conventional problems, and has as its feature to provide an apparatus control system that makes it possible to determine when using the equipment whether or not the parameter values that drive the production equipment arc optimal, and to provide a semiconductor exposure apparatus that is the target of such control, as well as a semiconductor exposure apparatus control method.

To solve the above-described problem, a system for controlling an apparatus, an exposure apparatus, a semiconductor device manufacturing method, a method for controlling an apparatus, and an exposure method of the present invention are mainly provided with the following configuration.

That is, in a system for controlling an apparatus, the system comprises setting means for setting parameter values for operating the apparatus;

operating means for operating the apparatus based on a first parameter value determined by the setting means;

inspection means for inspecting operating results of the apparatus based on the first parameter value set by the setting means; and determining means for determining a second parameter value from a first evaluation index indicating results of operating the apparatus according to the first parameter value obtained by the inspecting means and a second evaluation index indicating a predicted result of operating the apparatus according to a second parameter value different from the first parameter value obtained without inspecting by the inspecting means, the setting means setting the parameter value to the parameter value determined by the determining means, and the operating means operating the apparatus based on the parameter value determined by the determining means.

Moreover, an exposure apparatus comprises communication means for enabling communication with a control apparatus that controls information for controlling exposure; and control means for controlling the exposure apparatus based on information for controlling exposure that the control means receives via the communication means, the control apparatus receiving, via the communication means, a first evaluation index indicating operating results of the exposure apparatus controlled on the basis of information for controlling a first exposure, the evaluation index being obtained by a measuring means that measures an evaluation index indicating results of operating the exposure apparatus controlled by the control means, and determining the information from the first evaluation index and from a second evaluation index indicating results of operating of the apparatus controlled by the control means based on the information for controlling a second exposure different from the information for controlling the first exposure, the control means controlling the exposure apparatus using the information determined for controlling the first and second exposures.

Moreover, a semiconductor device manufacturing method comprises the steps of installing, in a factory, a plurality of semiconductor manufacturing apparatuses, including semiconductor exposure apparatuses; and manufacturing semiconductor devices using the plurality of semiconductor manufacturing apparatuses, the semiconductor exposure apparatus comprising communication means for enabling communication with a control apparatus that controls information for controlling exposure; and control means for controlling the exposure apparatus based on information for controlling exposure that the control means receives via the communication means, the control apparatus receiving, via the communication means, a first evaluation index indicating results of operating the exposure apparatus controlled on the basis of information for controlling a first exposure, the evaluation index being obtained by a measuring means that measures an evaluation index indicating results of operating the exposure apparatus controlled by the control means, determining the information from the first evaluation index and from a second evaluation index indicating results of operating the apparatus, controlled by the control means, based on the information for controlling a second exposure different from the information for controlling the first exposure, the control means controlling the exposure apparatus using the information determined for controlling the first and second exposures.

Moreover, a method for controlling an apparatus comprises the steps of setting parameter values for operating the apparatus to a first parameter value;

inspecting operating results of the apparatus on the basis of the first parameter value;

determining a parameter value from a first evaluation index indicating operating results and a second evaluation index indicating operating results of the apparatus according to a second parameter value different from the first parameter value obtained with inspecting; and operating the apparatus based on the parameter values determined in the determining step.

Moreover, the present invention provides a method for controlling an apparatus, the method comprises the steps of preparing a database for storing a plurality of control information for operating the apparatus, the database located on an outside network external to a factory in which the apparatus is installed;

connecting the apparatus to a local area network (LAN) inside the factory;

connecting an inspecting means for inspecting results of operating the apparatus to the LAN;

using the outside network and the LAN to receive, out of the plurality of control information, first control information and a first evaluation index indicating results of operating the apparatus, based on the first control information obtained by the inspecting means, and determining control information from the first control information and the first evaluation index received via the outside network and LAN, and from a second evaluation index indicating results of operating the apparatus based on second control information different from the first control information obtained without inspecting by the inspecting means; and setting the control information determined by the determining means in the apparatus using the outside network and the LAN.

Furthermore, an exposure method comprises the steps of setting an alignment parameter to a first value and obtaining first information relating to the wafer by detecting an alignment mark formed on a wafer;

setting the alignment parameter to a second value different from the first value and obtaining second information relating to the wafer by detecting the alignment mark;

exposing the wafer based on the first information;

inspecting the exposed wafer and obtaining an inspection result; and determining a value of the alignment parameter from the first information and the second information and the inspection result without performing exposure based on the second information, the value of the alignment parameter thus determined being selected from the first value and the second value.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 illustrates a second embodiment of the present invention, showing one example of apparatus control system architecture using semiconductor production equipment including semiconductor exposure apparatuses as an example;

FIG. 4 shows one example of the database that contains the equipment control parameters;

FIG. 5 shows another example of the database that contains the equipment control parameters;

FIGS. 12A, 12B and 12C are schematic diagrams showing AGA sample shot positions atop a wafer, a plan view of the mark elements, and an expanded view of a portion of the alignment signal shown in FIG. 11, respectively.

DETAILED DESCRIPTION OF THE PREFERRED EMBODIMENTS

Preferred embodiments of the present invention will be described in detail in accordance with the accompanying drawings.

(First Embodiment)

In the apparatus control system of the first embodiment, the control target apparatus is a semiconductor exposure apparatus, and a control method for optimizing the alignment between the wafer and the reticle (mask) during exposure is described with reference to FIGS. 1 and 2.

It should be noted that, of the control system according to the present invention, the semiconductor exposure apparatus alignment control system (alignment parameter value optimization) is called the OAP System (Optimization for Alignment Parameter in volume production). In this specification, that which is described as a parameter is not limited to ordinary parameters, but also includes sample shot positions, lighting method conditions for alignment marks, and the like, which are not directly translatable into numerical values.

Figure 1:
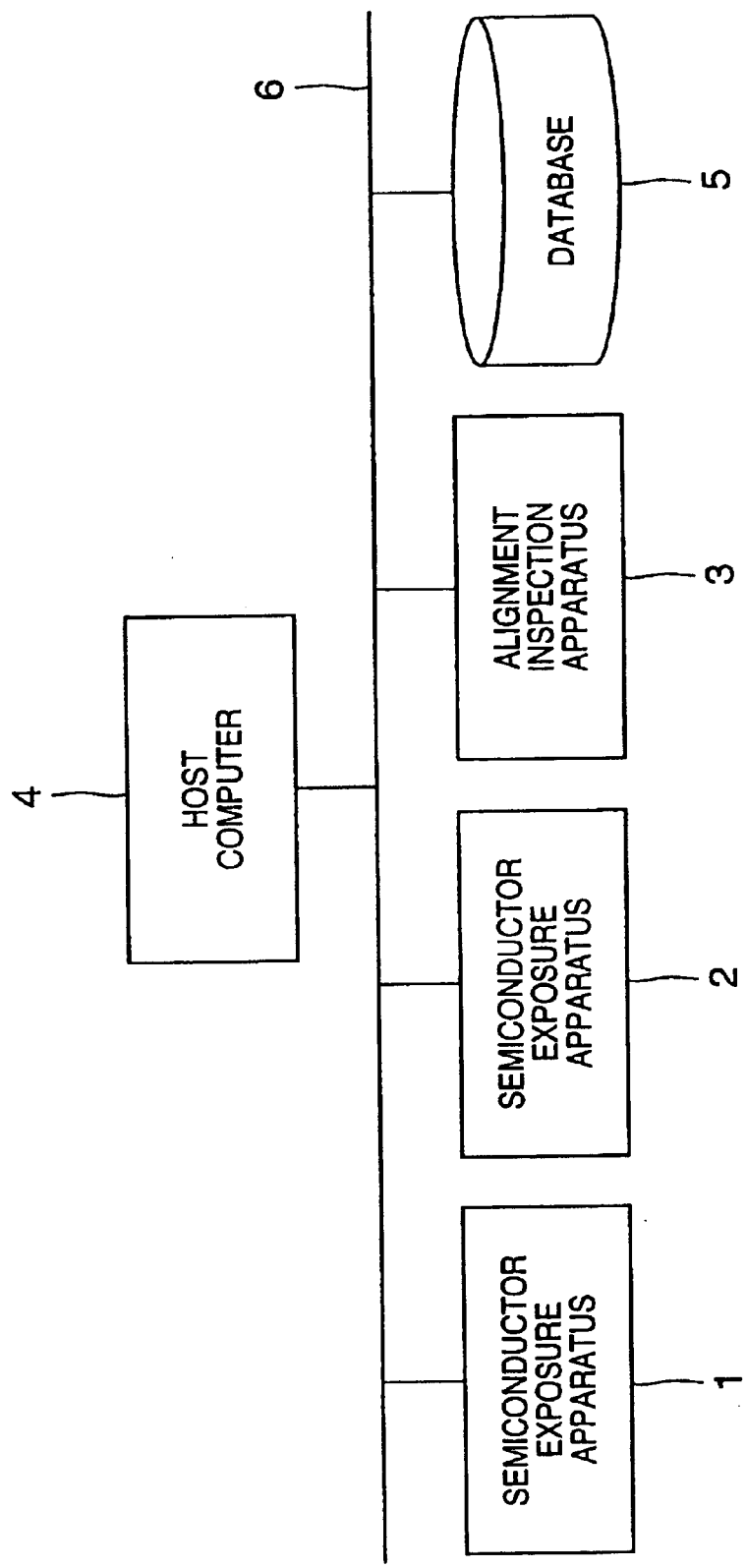
FIG. 1 shows the configuration of an OAP system that optimizes alignment parameter values.

FIG. 1 shows the configuration of an OAP system that optimizes alignment parameters. As shown in the diagram, semiconductor exposure apparatuses 1 and 2, alignment inspection apparatus 3 and database 5 are connected to a host computer (PC/WS) 4 by a LAN 6.

The host computer 4 is capable of transmitting data to and receiving data from the inspection apparatus 3 apparatus groups, respectively. (In FIG. 1, there are two semiconductor exposure apparatuses, but, of course, only one such semiconductor exposure apparatus or more than two such semiconductor exposure apparatuses may be connected to the LAN 6.) As shown in FIG. 4, for example, the database 5 contains conditions related to alignment, such as alignment signals, alignment inspection results, alignment mark-related information, lighting modes, shot arrangements, wafer magnification, wafer rotation and shift, as well as position detection results when detecting alignment mark positions based on those conditions and actual alignment results during exposure, based on those position detections.

A plurality of combinations (condition 1, 2, . . . n) of alignment conditions (alignment mark-related information, lighting mode, shot arrangement, etc.) and of alignment results (wafer-related information such as wafer magnification, wafer rotation, shift, etc.), based on these conditions, is stored in the database 5 (as shown in FIG. 5), so it is possible to select the optimum alignment conditions (parameter values) for obtaining a desired alignment result by referring to this data in the database.

To host computer 4, upon determining whether or not the parameter value settings and the exposure results based on those settings are suitable, references the above-described data and replaces (that is, updates) the equipment alignment parameters with the values at which the most desirable exposure results are obtained (alignment parameter value optimization). Alignment parameters suitable for optimization may include, for example, alignment mark line width, alignment mark width, alignment mark element spacing, global alignment sample shot arrangement, alignment optical system lighting mode (central wavelength, wavelength interval, σ), signal processing window width, and signal processing window center distance.

Figure 6:
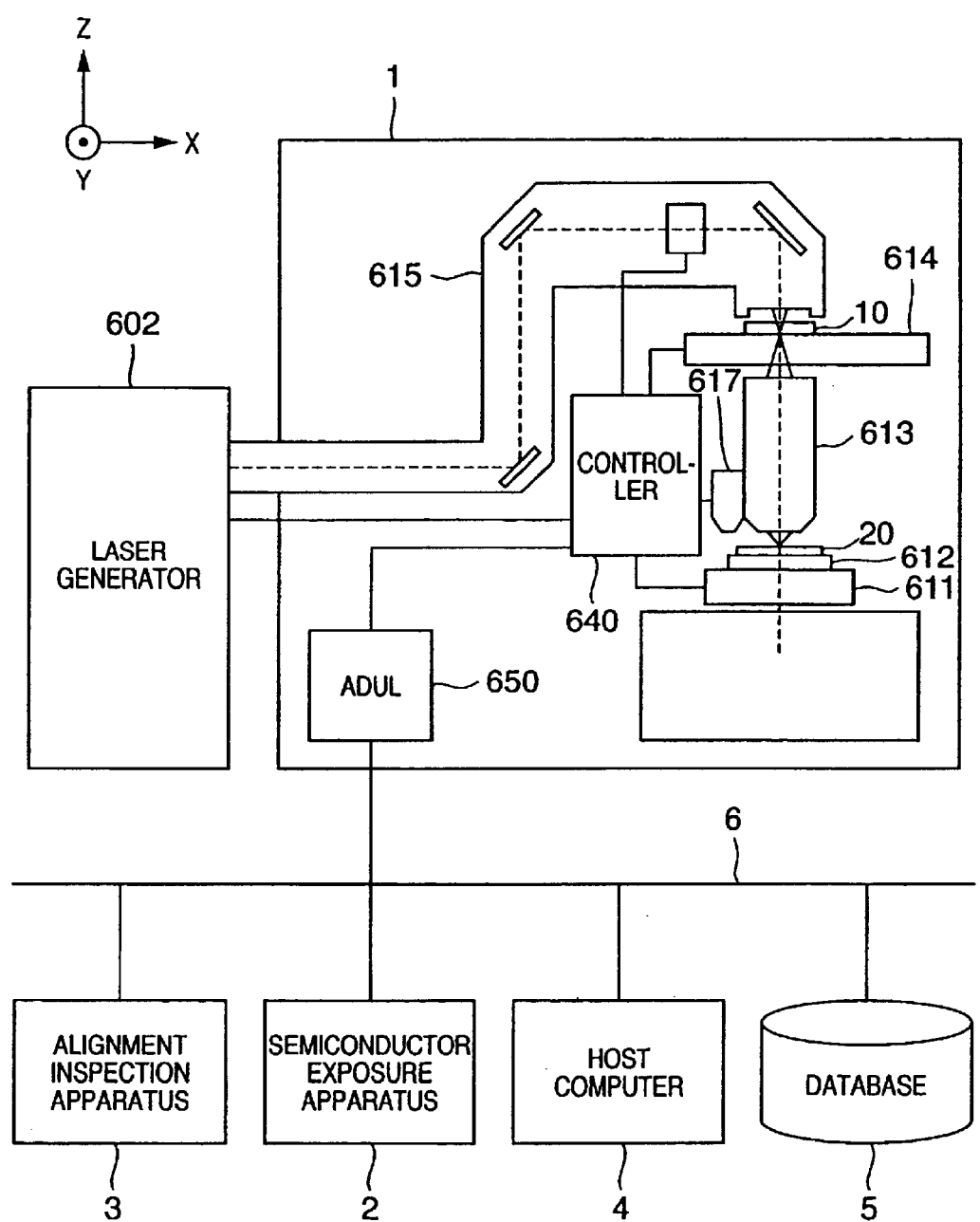
FIG. 6 illustrates the overall structure of the semiconductor exposure apparatus that is the object of control of an industrial apparatus, according to one embodiment of the present invention.

FIG. 6 illustrates the overall structure of the semiconductor exposure apparatus shown in FIG. 1. As shown in FIG. 6, a semiconductor exposure apparatus 1 exposes a pattern on a reticle 10 onto a wafer 20.

Also shown in FIG. 6 is a laser generator 602. The laser beam generated as exposure light is formed by a lighting optical system 615 and illuminates the pattern on the reticle 10.

The reticle 10 is retained on a stage 614 that can move in a reticle scanning direction within the x-y plane shown in the diagram. Reference numeral 613 denotes a projection system having a predetermined reduction scale. The pattern on the reticle 10 illuminated via the light optical system 615 is projected onto one of the shot regions of the wafer 20 by the projection system 613, and the wafer 20 is exposed with that pattern. The exposure forms a latent image on a resist that coats the wafer 20. The wafer 20 is placed on a wafer stage 611 via a wafer chuck 612. Reference numeral 617 denotes an alignment unit (alignment scope) that can detect alignment marks 30, like those depicted in FIG. 9, formed on the wafer 20.

The wafer stage 611 can tilt and rotate a wafer along all three dimensional axes x, y, and z, to permit control of the positioning of the wafer 20. Being able to control the vertical positioning of the wafer stage 611 along the z axis, for example, allows the projection system 613 to be precisely focused on the wafer 20.

Control of the movement and positioning of the reticle stage 614 and the wafer stage 611 is carried out using sensors (not shown in the diagram) that measure the position and orientation of the stage.

In addition, the reticle stage 614 and the wafer stage 611 are each connected to a controller 640, with reception of data in real-time, enabling synchronous control. In addition, the laser generator 602 is also similarly connected to the controller 640 so as to be able to synchronize the flash with the movements of the two stages 611 and 614.

A description will now be given of the principles of measuring the positions of the alignment marks, with reference to FIG. 9.

Figure 9:
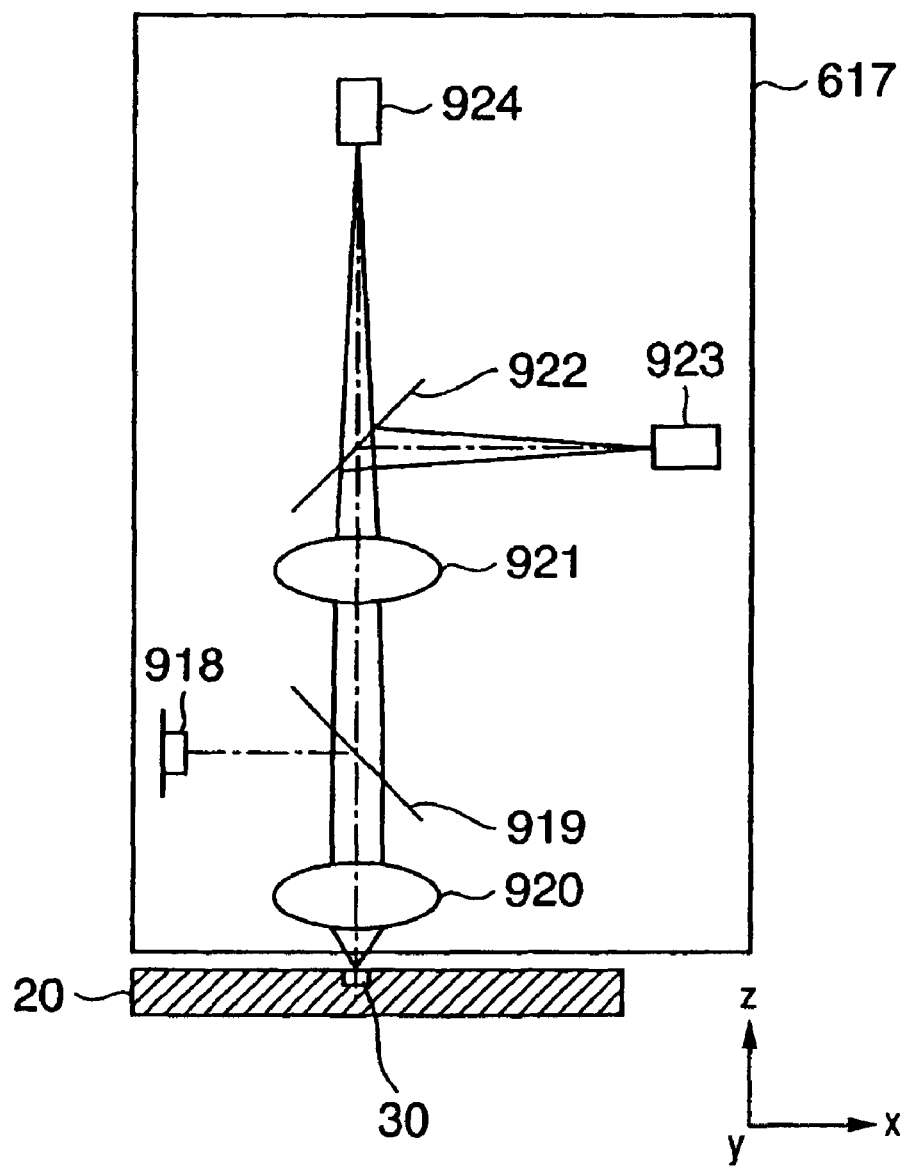
FIG. 9 is a block diagram showing the major components of an alignment unit according to one embodiment of the present invention.

FIG. 9 is a block diagram showing the major components of an alignment unit according to one embodiment of the present invention.

As shown in FIG. 9, a first beam splitter 919 reflects illumination light from a light source 918, which then passes through a first lens 920 to illuminate an alignment mark 30 on the wafer 20. The diffracted light from the alignment mark 30 then passes through the first lens 920, the first beam splitter 919 and a second lens 921, and is split by a second beam splitter 922, the light thus split then being detected by CCD sensors 923 and 924, respectively. Here, it should be noted that the alignment mark 30 is magnified by a factor of approximately one hundred by the first and second lenses 920, 921 before being focused on the CCD sensors 923, 924. The CCD sensors 923, 924 are used to measure the positions of the alignment mark in the X-axis direction and the Y-axis direction, respectively, and are arranged so as to be rotated ninety degrees from each other around the light axis.

The principles on which the measurements along the X-Y axes are based are the same for both the X axis and the Y axis, so the following description concentrates on measuring the position of the alignment mark 30 only along the X axis. It is to be understood that the same description is equally applicable to measurement of the position of the alignment mark 30 along the Y axis.

Figures 10A, 10B:
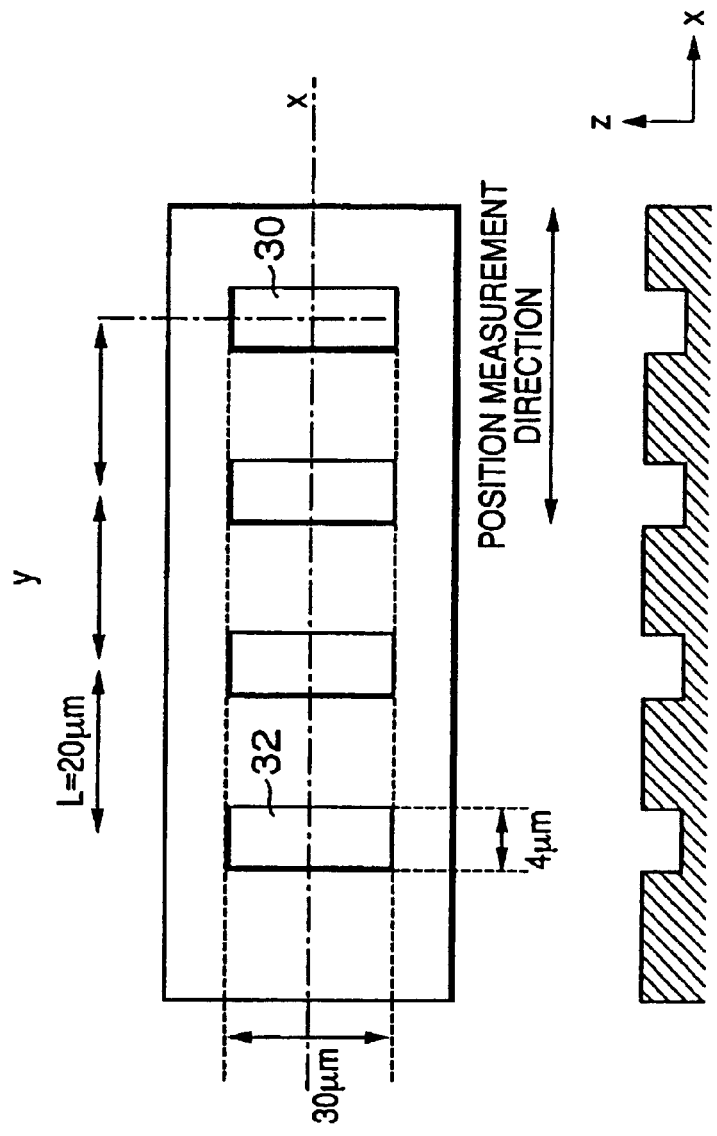
FIGS. 10A and 10B are diagrams showing a surface view of alignment marks and a cross-sectional view of alignment marks, respectively.

FIGS. 10A and 10B are diagrams showing a surface view of alignment marks and a cross-sectional view of alignment marks, respectively.

As shown in FIG. 10A, the alignment mark 30 of the present invention is configured so that a plurality of position detection strips 32 (sometimes also called alignment mark "elements") measuring 4 µm in an alignment measurement direction (X-axis direction) and 30 µm in a non-alignment direction (Y-axis direction) spaced parallel to each other a predetermined distance (length L=20 µm) apart. FIG. 10A shows four such position detection strips 32. As shown in FIG. 10B, in cross section, the position detection strips 32 are etched upward-facing concavities, with a resist (not shown in the diagram) painted on the top of the position detection strips 32. The CCD sensors 923 and 924 detect the reflected light obtained by exposing this plurality of position detection strips 32 to the illumination light, with the photo-electrically converted alignment signals shown in FIG. 11. The mark signals shown in FIG. 11 undergo further appropriate signal processing and the individual element positions (in order from left to right in FIG. 11: M1, M2, M3, M4) are detected. The intervallic spacing between the individual elements (in order from left to right in FIG. 11: L1, L2, L3) are hereinafter called "mark element intervals".

Next, a description will be given of the steps in a process of optimizing alignment parameter values in order to control the alignment of the reticle 10 and the wafer 20, with reference to FIG. 2.

Figure 2:
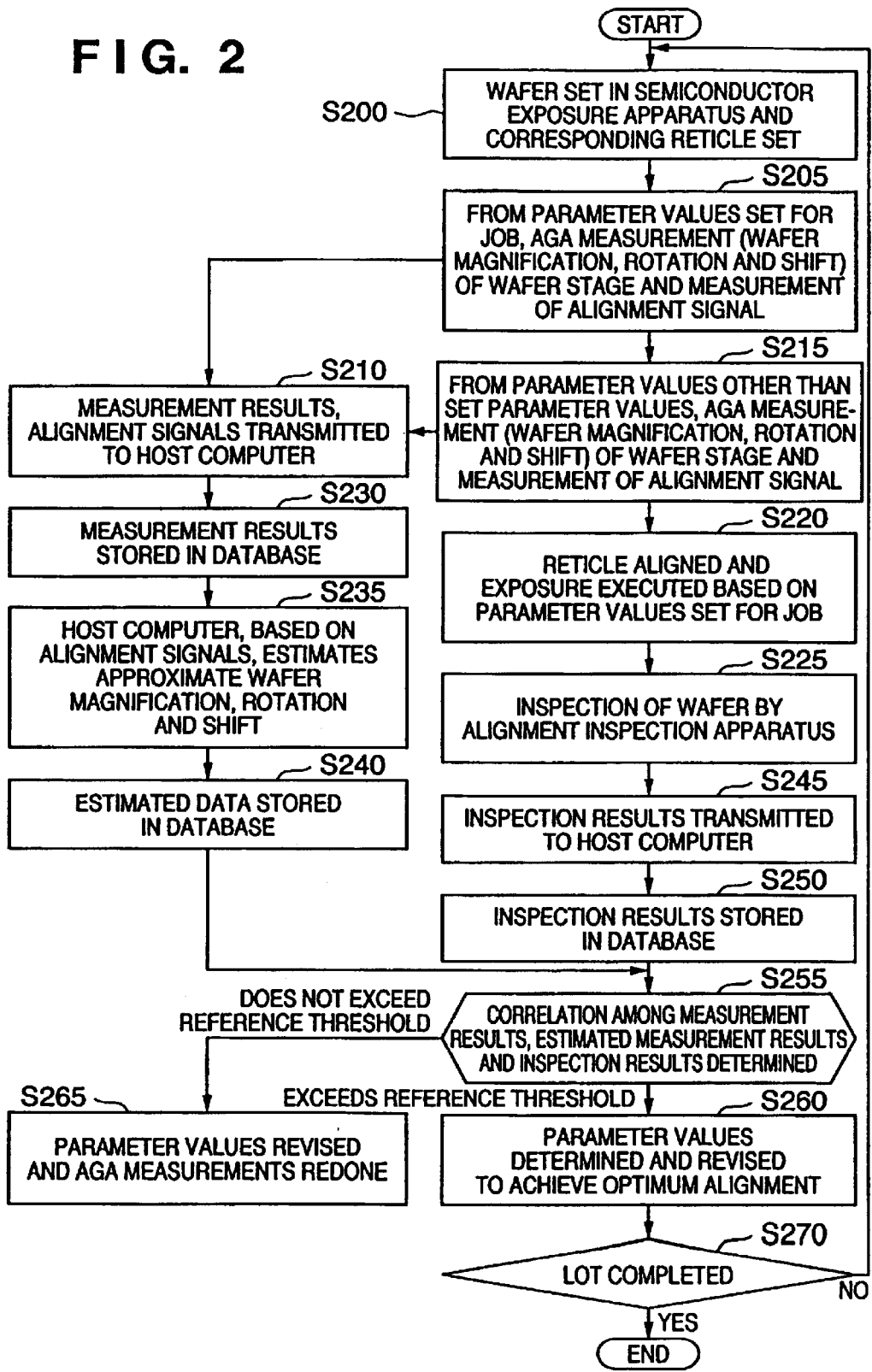
FIG. 2 shows the process of optimizing alignment parameter values in order to control the alignment of the reticle and the wafer.

FIG. 2 shows the process of optimizing alignment parameters in order to control the alignment of the reticle 10 and the wafer 20.

As shown in FIG. 2, first, in a step S200, preparation for the job (indicated as "JOB") of projecting the circuit pattern on the reticle onto the wafer is accomplished by transporting and inserting a wafer 20 into the semiconductor exposure apparatus 1 and setting the appropriate reticle 10 for that wafer 20 in the apparatus.

Next, in a step S205, the alignment parameters for aligning the wafer and the reticle in this job are set to specific values (which may be set in a storage unit (memory) in the semiconductor exposure apparatus 1 not shown in the diagrams), with the alignment unit 617 and the wafer stage 611 that holds the wafer being driven in accordance with these set parameters. The wafer stage 611 is equipped with position sensors for sensing the position of the stage. These position sensors, which are not shown in the diagram, may be laser interferometers, the output of which, together with the alignment mark position information from the alignment unit 617, indicates the extent of the shift, rotation and magnification (scale) of the wafer 20 on the wafer stage 611. These measurements are carried out using the widely known AGA (Advanced Global Alignment) method. AGA refers to global alignment for carrying out position measurements on the wafer at laser interferometer-equipped X-Y stage accuracy, and involves obtaining wafer magnification, wafer rotation and shift together with the execution of such statistical processing as the elimination of abnormal values.

The above-described resulting measurements, as well as the signal group (hereinafter referred to as alignment signals) measured as part of the process of deriving those measurements, are then forwarded to the host computer 4 via a communications unit (ADUL) 650 (shown in FIG. 6) in a step S210. The semiconductor exposure apparatus 1 main unit controls detection of the AGA measurements and the alignment signals, and is provided with a transmission unit (ADUL: Alignment Data Up Load) for the purpose of transmitting that information to the host computer 4. Use of this transmission unit enables data to be sent to and received from the host computer 4, and allows the controller 640 to receive parameters for controlling the apparatuses managed on the host computer 4 side and to control the apparatus.

Next, the process of setting the parameters to values other than the parameter values set in step S205 for the particular job in question as described above further involves redoing the AGA measurements and measuring the wafer magnification, wafer rotation and shift as well as alignment signals (in a step S215), and forwarding those measured results to the host computer 4 (in a step S210).

It should be noted that parameter values other than the parameter values for the particular job in question may be variables input from a separate data input interface not shown in the diagram, as well as data previously stored in the database 5.

In addition, it should be noted that the alignment signals detected by the AGA measurements carried out in steps S205 and S215 are not limited to signals for the extraction of such variables as the wafer magnification, rotation and shift, but may include other signals, as well.

When all of the relevant data in steps S205 and S215 has been collected, in a step S220, the wafer and the reticle are aligned and exposed based on the alignment results (wafer magnification, rotation and shift) obtained in step S205.

The wafer exposed during step S220 is then developed, and the developed wafer is inspected by the alignment inspection apparatus 3 in a step S225. Based on the results of the alignment inspection by the alignment inspection apparatus 3, it can be determined whether or not the alignment results obtained in step S205 are close to the actual wafer magnification, rotation and shift.

The alignment conditions according to the parameter values initially set (i.e., the parameters set in step S205 above) and the alignment conditions based on the exposure relation are inspected by the results of the inspection performed by the alignment inspection apparatus 3. More specifically, if the inspection results are good, then it can be known that the inspection results obtained in step S205 are close to the actual wafer magnification, rotation and shift and that, therefore, the parameter values set in step S205 are good. Conversely, if the alignment inspection results are bad, then it can be known that the alignment results obtained in step S205 are different from the actual wafer magnification, rotation and shift, and that, therefore, it can be known that the parameter values set in step S205 are not good.

In a step S230, the host computer 4 stores in the database 5 the alignment signals and alignment results such as wafer magnification, rotation and shift obtained by AGA measurement in steps S205 and S215.

Further, in a step S235, the host computer 4 signal-processes the alignment signals detected by AGA measurements in step S205 and/or step S215 using parameter values other than those set for the particular job in question in step S205 so as to obtain approximate wafer magnification, rotation and shift, which it then stores in the database 5 in a step S240. In step S235, the host computer 4 changes the values of those parameters not used when measuring the alignment signals, and one such parameter is the effective signal processing window width that limits the signal band when used when processing signals.

Figure 11:
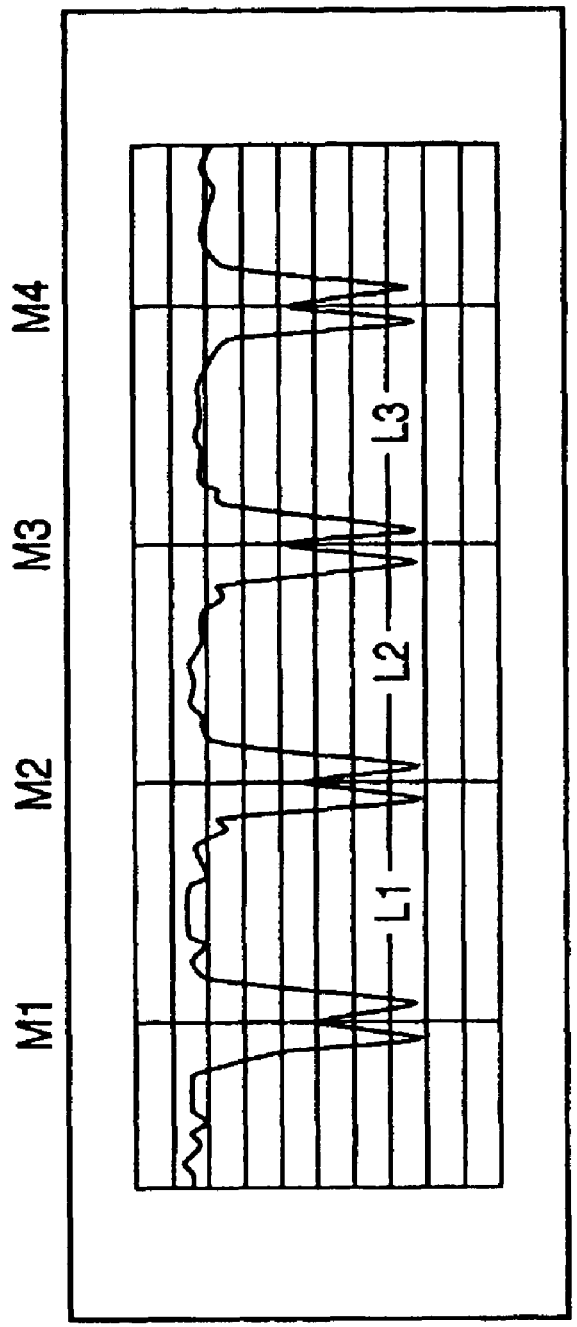
FIG. 11 is a chart showing alignment signals.

FIGS. 12A, 12B and 12C are schematic diagrams showing AGA sample shot positions atop a wafer, a plan view of the mark elements, and an expanded view of a portion of the alignment signal shown in FIG. 11, respectively.

The alignment signal shown in FIG. 12C undergoes signal processing to obtain the wafer magnification, rotation and shift alignment results. At this time, however, changing the effective signal processing window width WW that expresses the portion obtained as an effective signal, as well as the distance WC (processing window center distance) between the center of the window and the center of the alignment signal changes the wafer magnification, rotation and shift obtained. Accordingly, the effective signal processing window width WW and the processing window center distance WC can also become alignment parameters.

The inspection result data generated by the alignment inspection apparatus 3 is transferred by the host computer 4 in a step S245 and stored in the database 5 in a step S250 in the form of correspondences between the data stored in the above-described steps S230 and S240 and their respective parameter values.

In a step S255, the host computer 4 determines, for a designated wafer, a correlation between the alignment results obtained by AGA measurement (the wafer magnification, rotation and shift obtained in steps S205 and S215), the alignment results obtained by approximation from the alignment signals (the wafer magnification, rotation and shift obtained in step S235) and the alignment inspection results, and determines whether or not the currently set parameter values (the parameter values set for the particular job in question in step S205) provide optimum exposure results. More specifically, using the alignment results (A) obtained in step S205 as a reference, the host computer 4 expresses the alignment results (B) obtained in step S215 (actual measured results) and the alignment results (C) obtained by approximation in step S235 (estimated measured results) (that is, calculating that which is left after subtracting result (A) from result (B) and that which is left over from result (C) after subtracting result (A)), it can be known that, provided that the alignment results obtained in step S225 are good, the parameter values currently set are optimum. Moreover, if the alignment results are closest to what is left after subtracting results (A) from results (B), then it can be known that the parameter values set in step S215 are optimum, and if the alignment results are closest to what is left after subtracting results (A) from results (C), then it can be known that the parameter values used in step S235 are optimum (this is not shown in FIG. 2 and performed with this embodiment).

In addition, and more specifically, as another method, the host computer 4 has a reference threshold for determining whether the alignment inspection results are proper or not, and determines if (i) alignment inspection results as actual exposure results arising from execution of alignment based on alignment results (A), (ii) any alignment error (tolerance) that might arise during exposure based on alignment results (B), and (iii) any alignment error (tolerance) that might arise during exposure based on alignment results (C) are within permissible limits as established by the threshold. It should be noted that (ii) and (iii) above can also be known by subtracting (B)–(A), (C)–(A), respectively, from the alignment inspection results. Of (i), (ii) and (iii) above, the host computer 4 then extracts alignment parameter values for achieving results that exceed this reference threshold (but which are within permissible limits), deeming these extracted parameter values capable of providing optimum exposure results. In addition, in the event that multiple possibilities for achieving results that exceed the threshold value exist, the host computer 4 settles on the parameters that provide the best results (alignment results) as the optimum alignment parameters, so that those parameters are set for succeeding jobs (that is, for new lots or new wafers) in a step S260.

If, in step S255, there is nothing that achieves results that exceed the reference threshold, then the host computer 4 sets parameter values for that for which no parameter values were set in steps S205, S215 and S235, takes new AGA measurements and searches for new possibilities to achieve results that exceed the reference threshold in a step S265.

By repeating the procedure described above, even if there occur changes in the process or if changes are made in the exposure conditions and the object exposed, data is collected for the initial (or preceding) lot (or preceding wafer) and, based on that collected data, the optimum alignment parameter values can be selected and these optimized parameter values can be continuously reflected in the semiconductor exposure apparatus for succeeding lots (or continuing wafers).

It should be noted that the above-described parameter optimization operation can be adapted to optimize a plurality of parameters, and these values can be changed in steps S205 and S215 (and step S235). In addition, AGA measurements may be conducted multiple times with a plurality of different parameter values to obtain a plurality of alignment signals and a plurality of alignment results, such that, in steps S235, signal processing may be performed multiple times with a plurality of different parameter values to obtain a plurality of alignment results.

According to the processing routine shown in FIG. 2, optimum parameter values can be obtained and set within the process of mass production, without preparation and inspection of a special wafer apart from the mass production process. The advantage of such a capability is that there is no decrease in productivity, with the result that the effective capacity of the semiconductor exposure apparatus can be improved.

In the foregoing description, reference is made to a case in which values of parameters not used when measuring alignment signals in step S235 (signal processing window width, signal processing window center distance, etc.) are changed and the wafer magnification, rotation and shift are obtained by approximation. However, it is also possible to perform this approximation process in step S215 (at which time step S235 and S240 become unnecessary).

In addition, in a case in which only the values of those parameters used when measuring alignment signals are optimized, it is not necessary to perform steps 235 and S240.

In addition, in a case in which only the values of those parameters not used when measuring alignment signals are optimized, it is not necessary to perform step S215.

It should be noted that the above-described alignment parameters include a sample shot arrangement of a global alignment that takes into account combinations from shot A to shot L as shown in FIG. 12A. Here, "global alignment" refers to an alignment system that moves the wafer stage to the exposure position based on estimated calculations according to position information. FIG. 12A is a schematic diagram showing AGA sample shot positions atop a wafer.

In addition, alignment parameters also include mark element 32 width and line width. The mark elements 32 of the alignment mark 30 shown in FIGS. 10A and 10B are concave, but recent device processes employ mark elements 32 in which only the outlines are concave, in order to eliminate concavities from the wafer surface to the extent possible. For this reason, as shown in FIG. 12B, a mark width ML that represents a length of the mark element 32 in an alignment measurement direction, as well as a mark line width MLW that represents a width of the border lines of the mark element 32, may also become alignment parameters.

Here, FIG. 12B, is a schematic plan view of a mark element 32.

In addition, although in the foregoing description, the object of control is the alignment of industrial equipment in the form of a semiconductor exposure apparatus, the control of industrial apparatuses is not limited to such a situation but may, for example, be adapted to apparatuses for policing CMP apparatuses and the like, as well as to a variety of compositional elements of the semiconductor exposure apparatus such as (for example) the wafer focus function. Also, the present system and method can be used to optimize parameters as a reference for the purpose of calibrating scan electron microscopes, and the like.

As described above, according to the apparatus control system and control process of the present embodiment, parameters can be optimized while the apparatus is operating, thus maintaining high productivity and providing superior Cost of Ownership (CoO) apparatus management.

The exposure apparatus controlled by the above-described apparatus control system and control process can provide enhanced actual performance, making it possible to improve productivity and yield.

(Second Embodiment)

A description will now be given of a second embodiment of the present invention, in which operating results from an industrial apparatus are received remotely and the operating parameters are optimized and set to the apparatus.

FIG. 3 illustrates a second embodiment of the present invention. The semiconductor exposure apparatus is installed at the semiconductor producers' factories (in FIG. 3, semiconductor production equipment manufacturers A, B and C) and used in production. However, optimization of the parameters that control the apparatus may be carried out by either the semiconductor producer, the semiconductor production equipment manufacturer (that is, the apparatus user), or the vendor acting as a consultant. In any case, valid results can be obtained. Having the vendor conduct parameter control may sometimes be more effective because there are cases in which the vendor is privy to information that is not available to the user.

In the event that the vendor optimizes the parameters, then the semiconductor producer does not need to conduct such data processing and create the attendant database. Instead, the vendor can receive information about the equipment involved at a remote location using a data communications network such as the internet or a dedicated line, access its own database to fine-tune the parameters to an optimal state, and resend the newly established parameters over the data communications network to reset the equipment.

FIG. 3 shows one example of apparatus control system architecture, using semiconductor production equipment including semiconductor exposure apparatuses as an example, in which a plurality of factories 21, 22, 23 that run groups of apparatuses that include semiconductor exposure apparatuses to produce semiconductor devices and a vendor 25 situated at a location remote from the group of factories are connected via a data communications network 28, such as the internet or a dedicated line.

Industrial apparatuses 24a–c, 24d–f and 24g–i, associated control apparatuses 25a–c and factory-side operating apparatuses (first operating apparatuses) 26a–c, which operate the industrial apparatuses via the control apparatuses 25a–c, are installed at each of the factories 21, 22, 23. The industrial apparatuses that are the target of control may include, for example, such semiconductor production apparatuses as semiconductor exposure apparatuses, CVD apparatuses, etching apparatuses, CMP apparatuses, resist coating apparatuses, development apparatuses, ashing apparatuses and inspection apparatuses. As can be appreciated by those of skill in the art, however, the present invention is not limited to such a list.

The factory-side operating apparatuses 26a–d can operate the industrial apparatuses 24a–i via the control apparatuses 25a–c.

It should be noted that although the industrial apparatuses 24a–i and the factory-side operating apparatuses 26a–c, as well as the control apparatuses 25a–c, are shown in FIG. 3 as constituting separate units, these apparatuses may be partially or wholly combined. The factory-side operating apparatuses 26a–c typically act as monitors for monitoring the operating condition of the industrial apparatuses 24 and checking the parameters, as well as input means for inputting information (such as parameters, commands, programs, etc.) for operating the industrial apparatuses 24, and execute programs that control the operation of the factory-side operating apparatuses and control equipment.

The factories are provided with factory databases (35a, 35b, 35c), which are used to store such information as the factory side wishes to keep secret from the vendor. Such information might, for example, include the operating history of the industrial equipment or the parameters the factory set for that industrial equipment. Typically, the control apparatuses 26a–c prohibit access to the factory memory by the vendor 25 (that is, via a vendor operating apparatus 30). However, the vendor 25 may be permitted access to some or all of the information stored in the factory memory, in accordance with the permission granted by the factory.

The vendor operating apparatus (the second operating apparatus) 30 is provided at the vendor, who is situated at a location remote from the factories 21, 22, 23. The vendor operating apparatus 30 is connected to the control apparatuses 26a, 26b and 26c of the factories 21, 22 and 23, respectively, via the data communications network 28. The vendor operating apparatus 30 operates the industrial apparatuses 24a–i via the control apparatuses, and can obtain information indicating the operating condition of the industrial equipment.

The information that the vendor 25 receives via the data communications network 28 includes information for the purpose of controlling the industrial apparatuses individually controlled at the factories and measurement data for evaluating the operating condition of the industrial apparatuses.

The vendor 25 may, for example, receive control information relating to the industrial apparatuses 24a–c in place at Company A's factory 21 as well as evaluation values showing the operating results of the apparatuses based on that control information, at which point, the vendor 25 determines if that control information is appropriate data and, if not, sets different control data for achieving better apparatus operation and transmits that new control information to Company A's factory 21 via the data communications network 28 so that the control apparatus 26a and the operating apparatus 25a set the new parameters in the industrial apparatuses 24a–c.

The vendor operating apparatus 30 comprises a personal computer or workstation, and can execute processes for optimizing the instrument parameters like those explained with reference to FIG. 2 with respect to the first embodiment.

Communications utilizing the data communications network 28 follow packet communications protocol (TCP/IP). Within a given company, these communications may use a LAN, whereas between companies, these communications may use the internet. In alignment control in a semiconductor exposure apparatus, for example, the alignment signals are transmitted to the vendor 25 via the data communications network 28 and can be processed at the vendor operating apparatus 30.

The vendor operating apparatus 30 typically functions as a monitor for monitoring the operating condition of the industrial apparatuses 24 and checking the parameters, and includes an input unit for inputting information (such as parameters, commands, programs, etc.) for operating the industrial apparatuses 24 as well as a vendor database 27 for determining the optimization of the operating programs and parameters that control the vendor operating apparatus 30.

The vendor database 27 may, for example, be used to store unique technical information to be kept confidential as special know-how not to be disclosed to the factory 21 from among such types of data as the operating history of the industrial apparatuses 24a–i and the parameters set by the vendor 25 for the industrial apparatuses 24. Typically, access to this memory from the factory is prohibited, and access to some or all of the information stored in the vendor memory from the factory 21 may be granted by the vendor 25 as necessary.

The vendor operating apparatus 30 operates a controller designation unit that sets the conditions under which a person who controls the industrial apparatuses 24a–i operates equipment, as well as an information controller that controls access to the factory databases 35a–c and to the vendor database 27. The vendor operating apparatus 30 also operates the industrial apparatuses in accordance with instructions from the factory operating apparatuses 25a–c and the vendor operating apparatus 30, and moreover, can collect operating information based on that operation, select better operating conditions based on information stored in the database 27 and set optimum operating conditions for the equipment at the factory.

As described above, according to the apparatus control system and method of the present embodiment, the conditions that satisfy the highest standards of performance demanded of the equipment can be determined and the results transmitted to the factories via the data communications network 28 and set into each piece of equipment, thereby enabling control of equipment operation not by fixed parameters but by adjusting performance during operation of the equipment and reflecting any changes to the results in the control of succeeding operations.

The foregoing describes a semiconductor device production process using the above-described exposure apparatus and apparatus control system.

Figure 7:
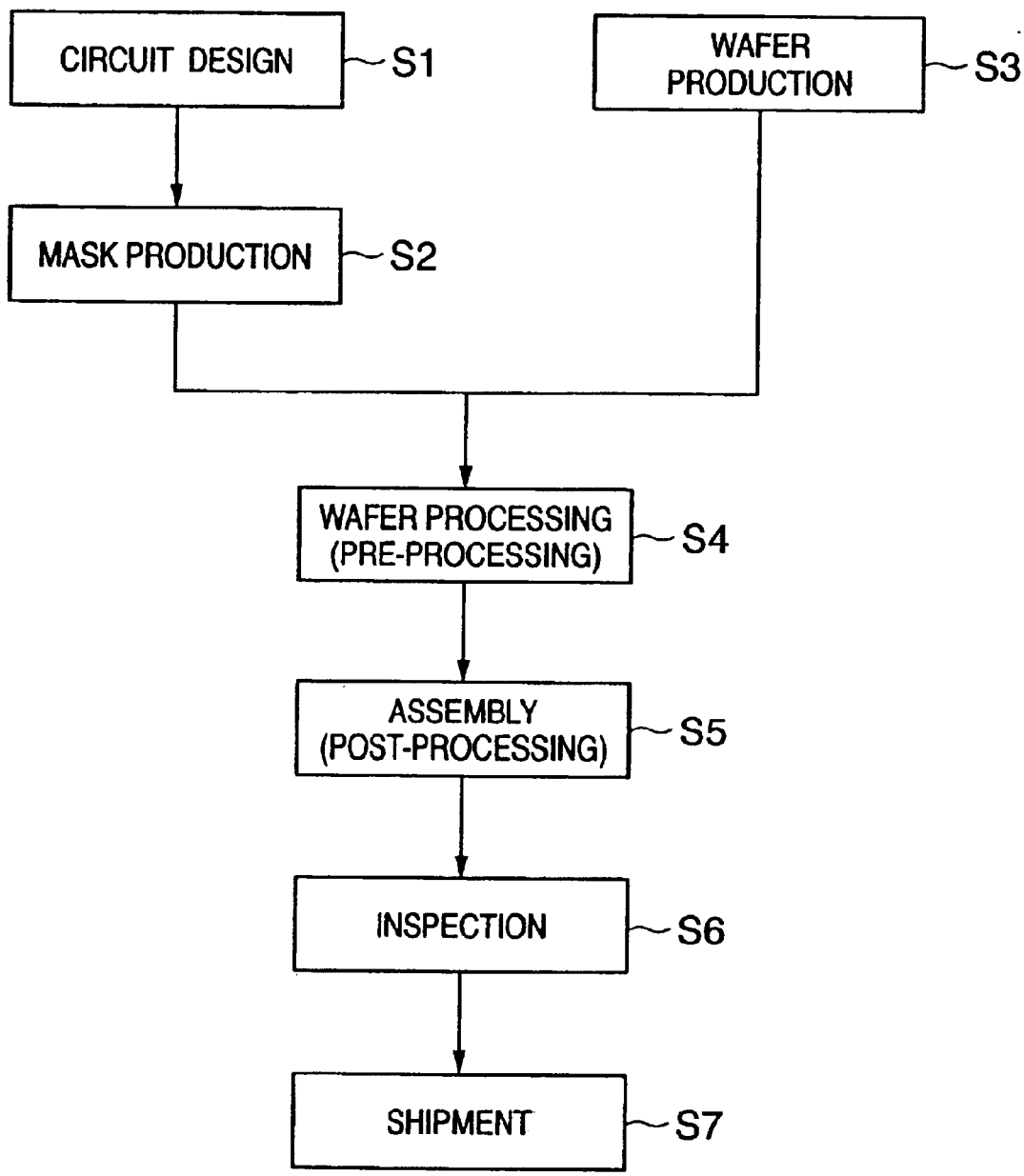
FIG. 7 is a flow chart of a device manufacturing process using an exposure apparatus according to one embodiment of the present invention.

FIG. 7 is a flow chart of an overall device manufacturing process using an exposure apparatus according to one embodiment of the present invention.

As shown in the diagram, a step S1 (circuit design) involves designing the circuit of the semiconductor device. A step S2 (exposure control data production) involves producing exposure control data for the exposure device based on the circuit pattern designed in step S1. A step S3 (wafer production), meanwhile, involves producing a wafer using a material such as silicon or the like. A step S4 (wafer processing), is called pre-processing, and involves using the mask and housing prepared as described above and forming an actual circuit in the wafer by lithography. A succeeding step S5 (assembly), called post-processing, involves using the wafer produced in step S4 to make a semiconductor chip and includes such assembly processes as assembly (dicing, bonding) and packaging (sealing the chip). A step S6 (inspection) involves testing the operation and reliability of the semiconductor device produced in step S5. By such steps is a semiconductor device completed and, in a step S7, shipped to customers. Pre-processing and post-processing, for example, may be performed in separate factories, in which case, the apparatuses at each of the factories are remote-controlled by the apparatus control system as described above. Also, information for apparatus control may also be exchanged between the preprocessing factory and the post-processing factory, via the internet or a dedicated communications network.

Figure 8:
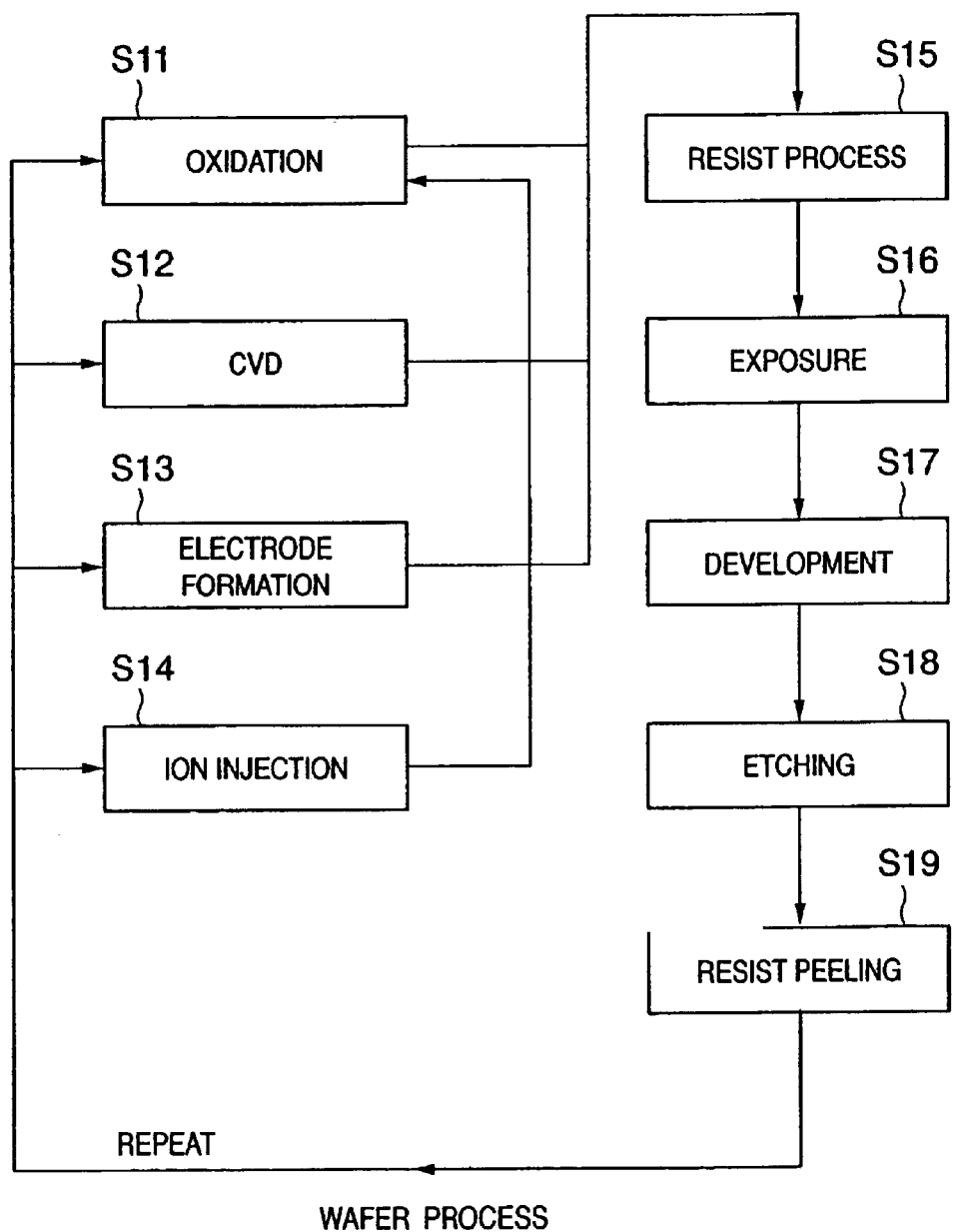
FIG. 8 is a flow chart of a wafer processing process using an expsoure apparatus according to one embodiment of the present invention.

FIG. 8 is a more detailed flow chart of the above-described wafer processing process using an exposure apparatus according to one embodiment of the present invention.

As shown in the diagram, in a step S11 (oxidation), the surface of the wafer is oxidized. In a step S12 (CVD), an insulating film is laid down over the surface of the wafer. In a step S13 (electrode formation), electrodes are vapor-formed on the wafer. In a step S14 (ion injection), the wafer is injected with ions. In a step S15 (resist process), the wafer is coated with a photosensitizer. In a step S16 (exposure), a circuit pattern is etched (exposed) on the surface of the wafer using the semiconductor exposure apparatus described above. In a step S17 (development), the exposed wafer is developed. In a step S18 (etching), everything but the developed resist image is scraped away. In a step S19 (resist peeling), the resist, which is no longer needed now that etching is completed, is removed. By repeating these steps, a multi-layered circuit pattern is formed on the wafer. The production equipment used in these steps is remote-controlled by the apparatus control system described above. As a result, there is no decline in productivity even with various changes in the production specifications, and the apparatus control parameters can be set, making it possible to provide an improvement in semiconductor device productivity as compared to the conventional art.

As described above, according to the apparatus control system and method of the present invention, parameter values can be optimized while the apparatus is operating, thus maintaining high productivity and providing superior Cost of Ownership (CoO) apparatus management.

The exposure apparatus controlled by the above-described apparatus control system and control process can provide enhanced actual performance, making it possible to improve productivity and yield.

In addition, with the remote control characteristic of the invention in certain of its embodiments as described above, the conditions that satisfy the highest standards of performance demanded of the equipment can be determined and the results transmitted to the factories via the data communications network 28 and set into each piece of equipment, thereby enabling control of equipment operation not fixed by parameters but by adjusting performance during operation of the equipment and reflecting any changes to the results in the control of succeeding operations.

As many apparently widely different embodiments of the present invention can be made without departing from the spirit and scope thereof, it is to be understood that the invention is not limited to the specific embodiments thereof except as defined in the claims.

What is claimed is:

1. A system for determining a parameter to be used corresponding to a condition under which a detection unit of an exposure apparatus detects position of a mark on a wafer to which a pattern is to be transferred by the exposure apparatus, said system comprising:
   a first acquisition unit to acquire first information of position of the mark detected by the detection unit under a first condition corresponding to a first parameter;
   a second acquisition unit to acquire second information of position of the mark detected by the detection unit under a second condition corresponding to a second parameter;
   a third acquisition unit to acquire third information of position of the pattern, on the wafer, transferred by the exposure apparatus based on the first information, the third information obtained by an inspection unit to inspect the transferred pattern on the wafer; and
   a determination unit to determine the parameter to be used based on the first to third information.

2. A system according to claim 1, wherein said determination unit estimates position of the pattern on the wafer, in case that the pattern is transferred by the exposure apparatus based on the second information, based on the first to third information, and determines the parameter to be used based on information of the estimated position and the third information.

3. A system according to claim 1, wherein one of the first and second information comprises information of at least one of magnification, rotation and shift of the wafer.

4. A system according to claim 1, wherein the parameter to be used comprises a plurality of sub parameters corresponding to respective sub conditions of the condition.

5. A system according to claim 1, wherein the parameter to be used concerns a sample shot arrangement for global alignment of the wafer.

6. A system according to claim 1, wherein the parameter to be used concerns a shape of the mark.

7. A system according to claim 1, wherein the parameter to be used concerns a signal processing condition for a detected signal corresponding to the mark.

8. A system according to claim 1, wherein the parameter to be used concerns an illumination condition for the mark.

9. A system according to claim 1, wherein said system comprises at least one of said exposure apparatus, said inspection unit, and a host computer.

10. A method of manufacturing a device, said method comprising steps of:
    determining a parameter to be used corresponding to a condition under which a detection unit of an exposure apparatus detects position of a mark on a wafer to which a pattern is to be transferred by the exposure apparatus, using a system as defined in claim 1;
    transferring the pattern to the wafer using the exposure apparatus in which the determined parameter is used;
    developing the wafer to which the pattern has been transferred; and
    processing the developing wafer to manufacture the device.

11. A method of determining a parameter to be used corresponding to a condition under which a detection unit of an exposure apparatus detects position of a mark on a wafer to which a pattern is to be transferred by the exposure apparatus, said method comprising steps of:
    a first acquisition of acquiring first information of position of the mark detected by the detection unit under a first condition corresponding to a first parameter;
    a second acquisition of acquiring second information of position of the mark detected by the detection unit under a second condition corresponding to a second parameter;
    a third acquisition of acquiring third information of position of the pattern, on the wafer, transferred by the exposure apparatus based on the first information, the third information obtained by an inspection unit to inspect the transferred pattern on the wafer; and
    determining the parameter to be used based on the first to third information.

12. A method according to claim 11, wherein said determination step estimates position of the pattern on the wafer, in case that the pattern is transferred by the exposure apparatus based on the second information, based on the first to third information, and determines the parameter to be used based on information of the estimated position and the third information.

13. A method according to claim 11, wherein one of the first and second information comprises information of at least one of magnification, rotation and shift of the wafer.

14. A method according to claim 11, wherein the parameter to be used comprises a plurality of sub parameters corresponding to respective sub conditions of the condition.

15. A method according to claim 11, wherein the parameter to be used concerns a sample shot arrangement for global alignment of the wafer.

16. A method according to claim 11, wherein the parameter to be used concerns a shape of the mark.

17. A method according to claim 11, wherein the parameter to be used concerns a signal processing condition for a detected signal corresponding to the mark.

18. A method according to claim 11, wherein the parameter to be used concerns an illumination condition for the mark.

19. A method according to claim 11, wherein said method is executed by at least one of the exposure apparatus, the inspection unit, and a host computer.

20. A method of manufacturing a device, said method comprising steps of:

determining a parameter to be used corresponding to a condition under which a detection unit of an exposure apparatus detects position of a mark on a wafer to which a pattern is to be transferred by the exposure apparatus, in accordance with a method as defined in claim 11.

transferring the pattern to the wafer using the exposure apparatus in which the determined parameter is used;

developing the wafer to which the pattern has been transferred; and processing the developed wafer to manufacture the device.

21. An exposure apparatus for transferring a pattern to a wafer, said apparatus comprising:

a detection unit to detect position of a mark on the wafer; and a system, for determining a parameter to be used corresponding to a condition under which said detection unit detects the position of the mark, as defined in claim 1.

* * * * *